United States Patent
Chen et al.

(10) Patent No.: US 7,331,379 B2
(45) Date of Patent: Feb. 19, 2008

(54) HEAT DISSIPATION DEVICE WITH HEAT PIPE

(75) Inventors: Chun-Chi Chen, Guangdong (CN); Shi-Wen Zhou, Guangdong (CN); Zhan Wu, Guangdong (CN)

(73) Assignees: Fu Zhun Precision Industry (Shen Zhen) Co., Ltd., Bao'an District, Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 163 days.

(21) Appl. No.: 11/164,458

(22) Filed: Nov. 23, 2005

(65) Prior Publication Data

US 2007/0012428 A1    Jan. 18, 2007

(30) Foreign Application Priority Data

Jul. 18, 2005    (CN) .................. 2005 1 0036093

(51) Int. Cl.
*F28D 15/02* (2006.01)

(52) U.S. Cl. ................. 165/104.33; 361/700; 165/181

(58) Field of Classification Search ............... 165/181, 165/182, 104.26, 104.33; 361/700
See application file for complete search history.

(56) References Cited

U.S. PATENT DOCUMENTS 2,462,511 A * 2/1949 Kramer ...................... 165/150
3,780,799 A * 12/1973 Pastemak .................... 165/150
4,580,623 A * 4/1986 Smitte et al. ............... 165/150
5,540,276 A * 7/1996 Adams et al. .............. 165/151
6,542,364 B2   4/2003 Lai et al.
6,625,021 B1   9/2003 Lofland et al.
7,021,368 B2 * 4/2006 Lin et al. ............... 165/104.33
7,188,663 B2 * 3/2007 Lin ....................... 165/104.33
2003/0141041 A1 * 7/2003 Chen ........................ 165/80.3
2003/0183373 A1  10/2003 Sarraf et al.
2004/0188063 A1   9/2004 Chang
2005/0103473 A1 * 5/2005 Todd et al. ............. 165/104.11
2005/0103474 A1 * 5/2005 Lee et al. .............. 165/104.33

* cited by examiner

*Primary Examiner*—Teresa J. Walberg
(74) *Attorney, Agent, or Firm*—Winston Hsu

(57) ABSTRACT

A heat dissipation device includes a fin set, a sinuous heat pipe transferring heat to different parts of the fin set, and a base thermally contacting the heat pipe. The heat pipe has a middle U-shaped portion and two L-shaped portions at two sides of the U-shaped portion, respectively. The base is for contacting with a heat generating electronic device and transferring heat from the electronic device to the heat pipe and the fin set. The fin set defines a passageway in a middle of thereof. The U-shaped portion of the heat pipe is received in the passageway of the fin set and thermally engages with the fin set.

21 Claims, 6 Drawing Sheets

HEAT DISSIPATION DEVICE WITH HEAT PIPE

FIELD OF THE INVENTION

The present invention relates to a heat dissipation device for use in removing heat from electronic devices, and more particularly to a heat dissipation device incorporating a heat pipe for improving heat dissipation efficiency of the heat dissipation device.

DESCRIPTION OF RELATED ART

During operation of an electronic device such as a computer central processing unit (CPU), a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device comprises a solid metal base attached on the CPU, and a plurality of fins arranged on the base. The base is intimately attached on the CPU thereby absorbing the heat generated by the CPU. Most of the heat accumulated at the base is transferred firstly to the fins and then dissipated from the fins. However, the electronics technology continues to advance, and increasing amounts of heat are being generated by powerful state-of-the-art CPUs. Many conventional heat dissipation devices are no longer able to efficiently remove heat from these CPUs.

In order to overcome the above disadvantages of the heat dissipation device, one type of heat dissipation device used for the electronic device includes a heat pipe which can quickly transfer heat from a position to another position of the heat dissipation device. A heat pipe is a vacuum-sealed pipe that is filled with a phase changeable fluid, usually being a liquid, such as water, alcohol, acetone and so on, and has an inner wall thereof covered with a capillary configuration. As the electronic device heats up, a hot section usually called evaporating section of the heat pipe which is located close to the electronic device also heats up. The liquid in the evaporating section of the heat pipe evaporates and the resultant vapor reaches a cool section usually called condensing section of the heat pipe and condenses therein. Then the condensed liquid flows to the evaporating section along the capillary configuration of the heat pipe. This evaporating/condensing cycle repeats and since the heat pipe transfers heat so efficiently, the evaporating section is kept at or near the same temperature as the condensing section of the heat pipe. Correspondingly, heat-transfer capability of the heat dissipation device including such the heat pipe is improved greatly.

Typically, a heat dissipation device illustrated as follows is used widely. The heat dissipation device comprises a base for contacting with a heat generating electronic device, a plurality of fins arranged on the base and at least one heat pipe thermally contacting the base. Each heat pipe is substantially U-shaped and has an evaporating section thermally positioned on the base and a condensing section substantially parallel to the evaporating section and thermally contacting an upper part of the fins, and a connecting section connecting the evaporating section and the condensing section. In use, heat generated by the electronic device is absorbed by the base, and transferred from the base to a lower part of the fins and the evaporating section of the heat pipe. The heat in the evaporating section of the heat pipe is subsequently transmitted to the condensing section and then the upper part of the fins and dissipated by the fins to ambient air. However, the heat pipe only has the condensing section contacting with the upper portion of the fins; thus, the heat generated by the electronic device only reaches the lower and upper parts of the fins via the base and the condensing section of the heat pipe. Nevertheless, due to heat resistance of material of the fins, the heat in the lower and upper parts spreading to other parts of the fins is retarded. As a result, the heat delivered by the heat dissipation device is accumulated in the lower and upper parts of the fins and not distributed in the fins evenly. Therefore, heat dissipation efficiency of the heat dissipation device is not optimal and can not meet with the higher and higher heat dissipation demand of the electronic device.

What is needed, therefore, is a heat dissipation device which is capable of having heat generated by a heat generating device evenly distributed thereon and has great heat dissipation capability.

SUMMARY OF INVENTION

A heat dissipation device in accordance with a preferred embodiment of the present invention comprises a fin set, at least a sinuous heat pipe transferring heat to different parts of the fin set, and a base thermally contacting the at least a heat pipe. The base is for contacting with a heat generating electronic device and transferring the heat from the electronic device to the heat pipe and the fin set. The fin set comprises a plurality of fins. The fins of the fin set corporately define at least a passageway in a middle of thereof. The at least a heat pipe comprises a U-turn portion received in the at least a passageway of the fin set and thermally engaging with the fin set at two edges of the passageway.

Other advantages and novel features of the present invention will become more apparent from the following detailed description when taken in conjunction with the accompanying drawings, in which:

DETAILED DESCRIPTION

Figure 1:
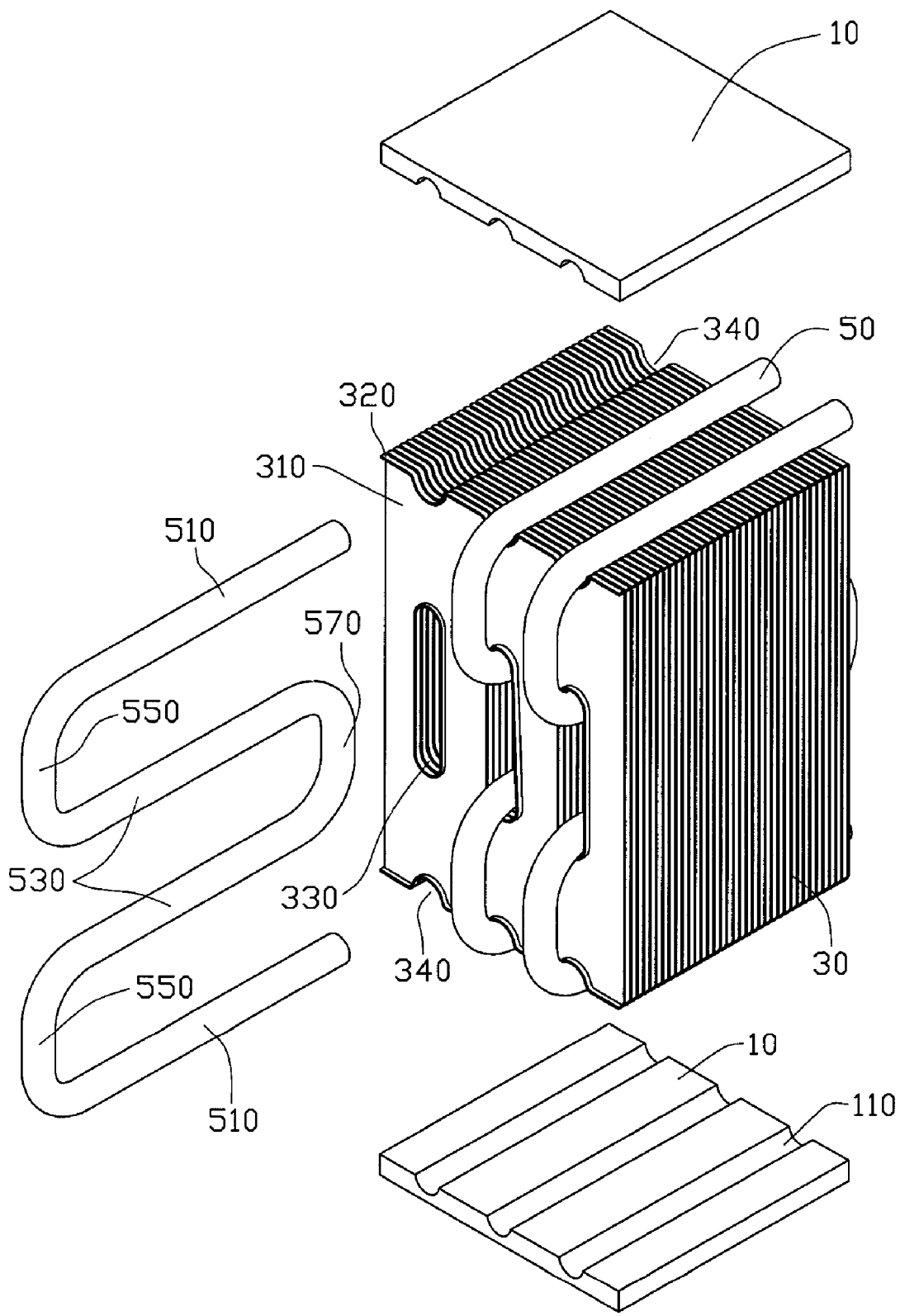
FIG. 1 is an exploded isometric view of a heat dissipation device in accordance with a first embodiment of the present invention.
Figure 2:
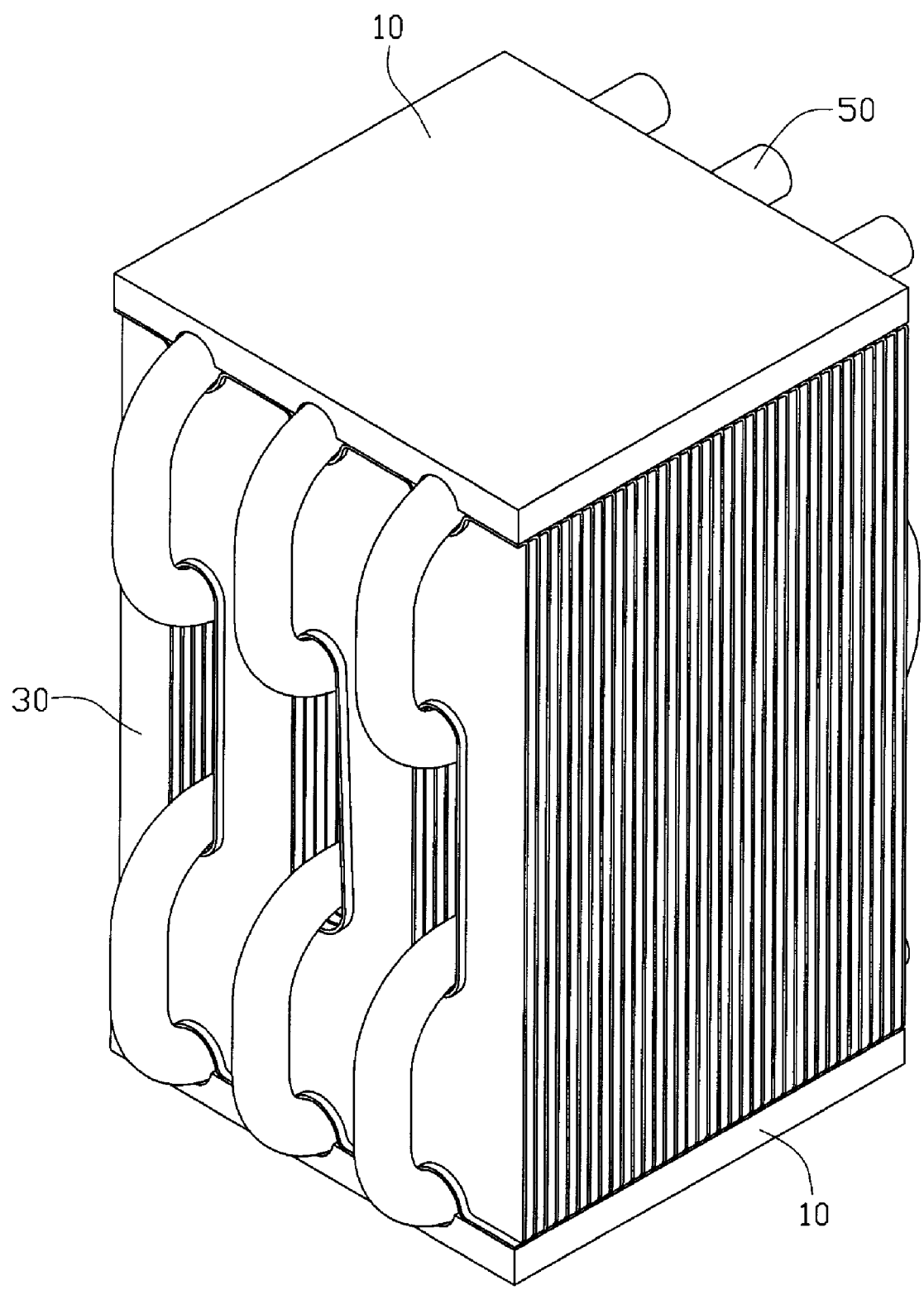
FIG. 2 is an assembled view of FIG. 1.

Referring to FIGS. 1 and 2, a heat dissipation device of a first embodiment of the present invention comprises two bases 10, a plurality of fins 30 sandwiched between the two bases 10 and three heat pipes 50 thermally contacting the fins 30 and the bases 10.

Each base 10 is a substantially rectangular metal plate having high thermal conductivity, and has a bottom face (not labeled) for contacting with an electronic device (not shown) and a top face (not labeled) opposite to the bottom face.

Three parallel grooves 110, each has a semicircular cross section, are substantially evenly defined in the top face of the base 10 for receiving the heat pipes 50 therein.

Each of the fins 30 is substantially rectangular in shape and made from a metal sheet. Each fin 30 comprises a body 310 and two flanges 320 perpendicularly extending from two opposite edges of the body 310. The body 310 of each fin 30 defines three parallel lengthwise slots (not labeled) in a middle part thereof, each fin having a looped flange (not labeled) formed at a circumference of each slot. Each flange 320 of each fin 30 has three concaves (not labeled) corresponding with the grooves 110 of the base 10. The fins 30 are assembled together with the flanges 320 of each fin 30 adjoining the body 310 of the adjacent fins 30. The slots of the fins 30 corporately define three through passageways 330 for receiving the heat pipes 50 therein. The concaves of the flanges 320 corporately define three parallel grooves 340 at the two opposite edges of the fins 30 for receiving the heat pipes 50 therein.

Each of the heat pipes 50 is substantially serpentine. In this case, each heat pipe 50 comprises two L-shaped portions and a U-turn portion located between and connecting with the two L-shaped portions. Each L-shaped portion comprises a first section 510 and a first connecting section 550. The U-turn portion comprises two parallel second sections 530 and a second connecting section 570 between the two second sections 530. The two first sections 510 of the two L-shaped portions are substantially parallel to each other. Each first connecting section 550 extends perpendicularly from the first section 510 and connects the adjacent first section 510 and second section 530 together. The two second sections 530 extend perpendicularly from the first connecting sections 550, respectively, and substantially parallel to the first sections 510. The second connection section 570 is perpendicular to and connects the two second sections 530 together. A round corner is formed at each of joints of the sections 510, 530, 550, 570 of each heat pipe 50.

In assembly, each first section 510 of each heat pipe 50 is received in the corresponding groove 110 of the base 10 and groove 340 of the fins 30 and thermally contacts the base 10 and the fins 30. A free end of each first section 510 projects beyond the base 10 and the fins 30. The U-turn portion of each heat pipe 50 is received in the corresponding passageway 330 of the fins 30 with the two second sections 530 thermally contacting each of the fins 30 at upper and bottom edges of the passageway 330. The two first connecting sections 550 are positioned at a side of the fins 30. The second connecting section 570 of the heat pipe 50 is positioned at an opposite side of the fins 30.

In use of the heat dissipation device of the embodiment of the invention, one of the two bases 10 is attached to the electronic device and absorbs heat from the electronic device. A lower part of the fins 30 close to the base 10 absorbs heat accumulated on the base 10 and then dissipates the heat to ambient air. The first sections 510 of the heat pipes 50 attached to the base 10 absorb the heat accumulated on the base 10 and deliver the heat to the second sections 530 and the other first sections 510 via the first connecting sections 550 and the second connecting section 570 of the heat pipes 50. The heat in the second sections 530 is subsequently transmitted to the middle part of the fins 30 and dissipated by the fins 30. The heat in the other first sections 510 is transmitted to an upper part of the fins 30 and the other base 10 and then dissipated by the fins 30 and the other base 10.

According to the preferred embodiment of the present invention, it can be understood that, the heat pipe 50 has the first sections 510 thermally contact two sides of the fins 30 and the second sections 530 thermally contacting the middle part of the fins 30. Thus, the heat generated by the electronic device can be rapidly transmitted to the lower, upper and middle parts of the fins 30 by the heat pipes 50. Therefore, in comparison with the conventional heat dissipation device, the heat generated by the electronic device can be more rapidly transferred to the fins 30 and more evenly spread in the fins 30 via the heat pipes 50 of the heat dissipation device of the present invention, whereby the heat can being effectively dissipated.

Figure 3:
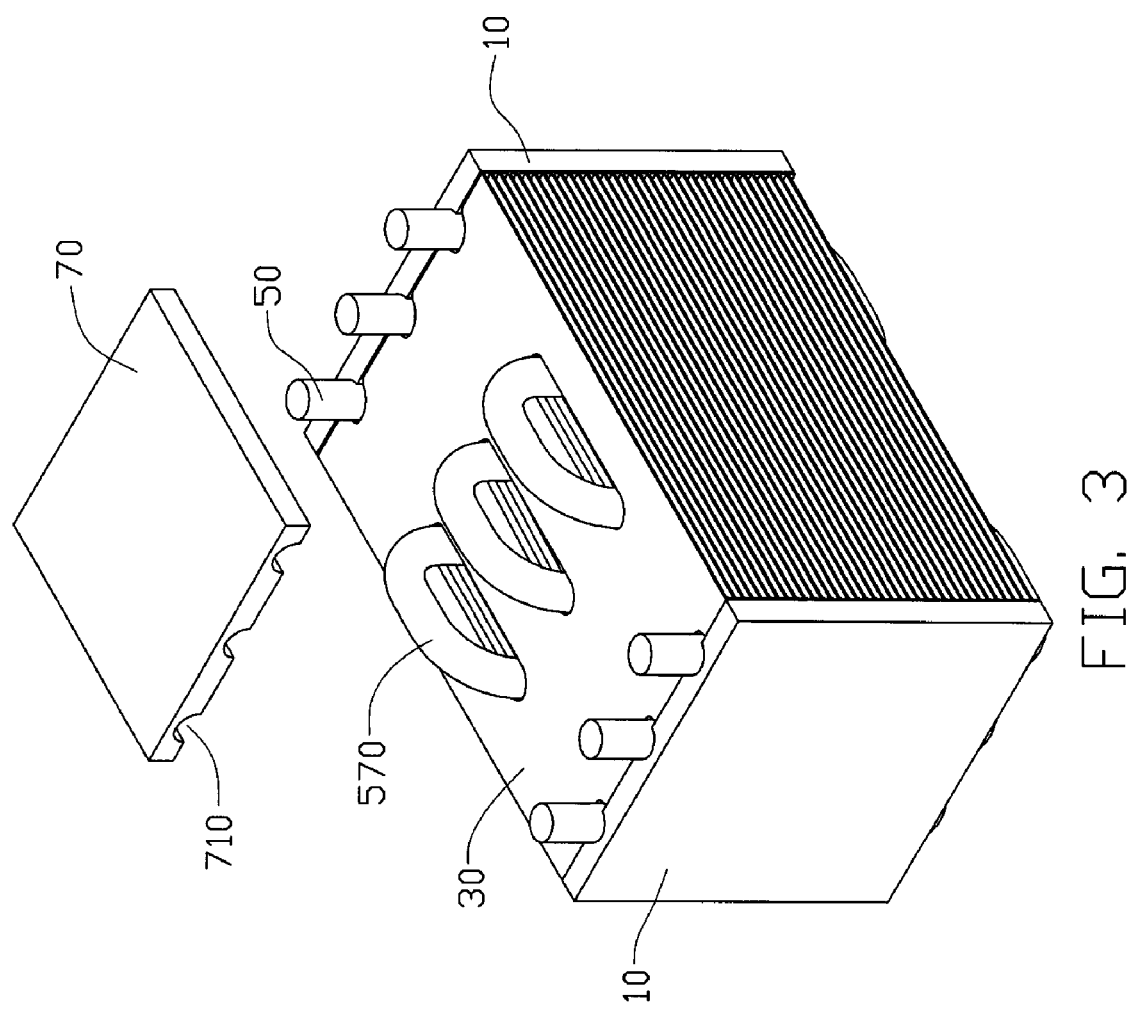
FIG. 3 is an inverted and partially exploded isometric view of a heat dissipation device in accordance with a second embodiment of the present invention.
Figure 4:
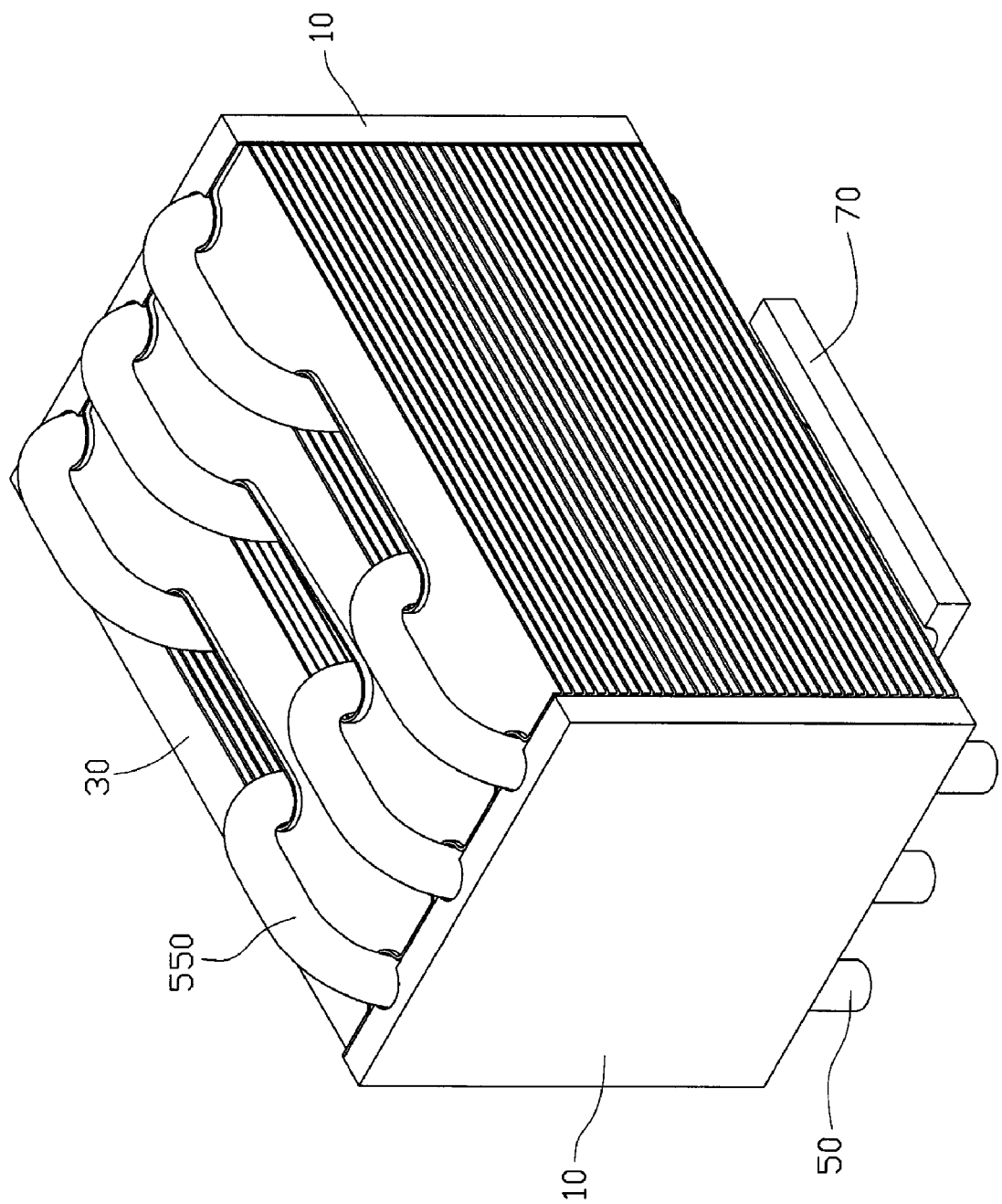
FIG. 4 an assembled view of FIG. 3 but in a normal state.

Referring to FIGS. 3 and 4, a heat dissipation device of a second embodiment of the invention is shown. The heat dissipation device is similar to the heat dissipation device of the first embodiment of the invention. The difference therebeween is that the heat dissipation device further comprises a plate 70 thermally contacting the heat pipes 50. The plate 70 defines three parallel grooves 710 therein, the second connecting sections 570 of the heat pipes 50 are respectively received in the grooves 710 and soldered to the plate 70. In use, the plate 70 is attached to the electronic device, the heat generated by the electronic device is absorbed by the plate 70 and transferred to the second connecting sections 570 of the heat pipes 50. The heat in the second connecting sections 570 is subsequently transferred to the middle part of the fins 30 via the second sections 530 of the heat pipes 50, and two lateral parts of the fins 30 and the two bases 10 via the first sections 510 of the heat pipes 50. Finally the heat is dissipated to surrounding environment by the fins 30 and the bases 10.

Figure 5:
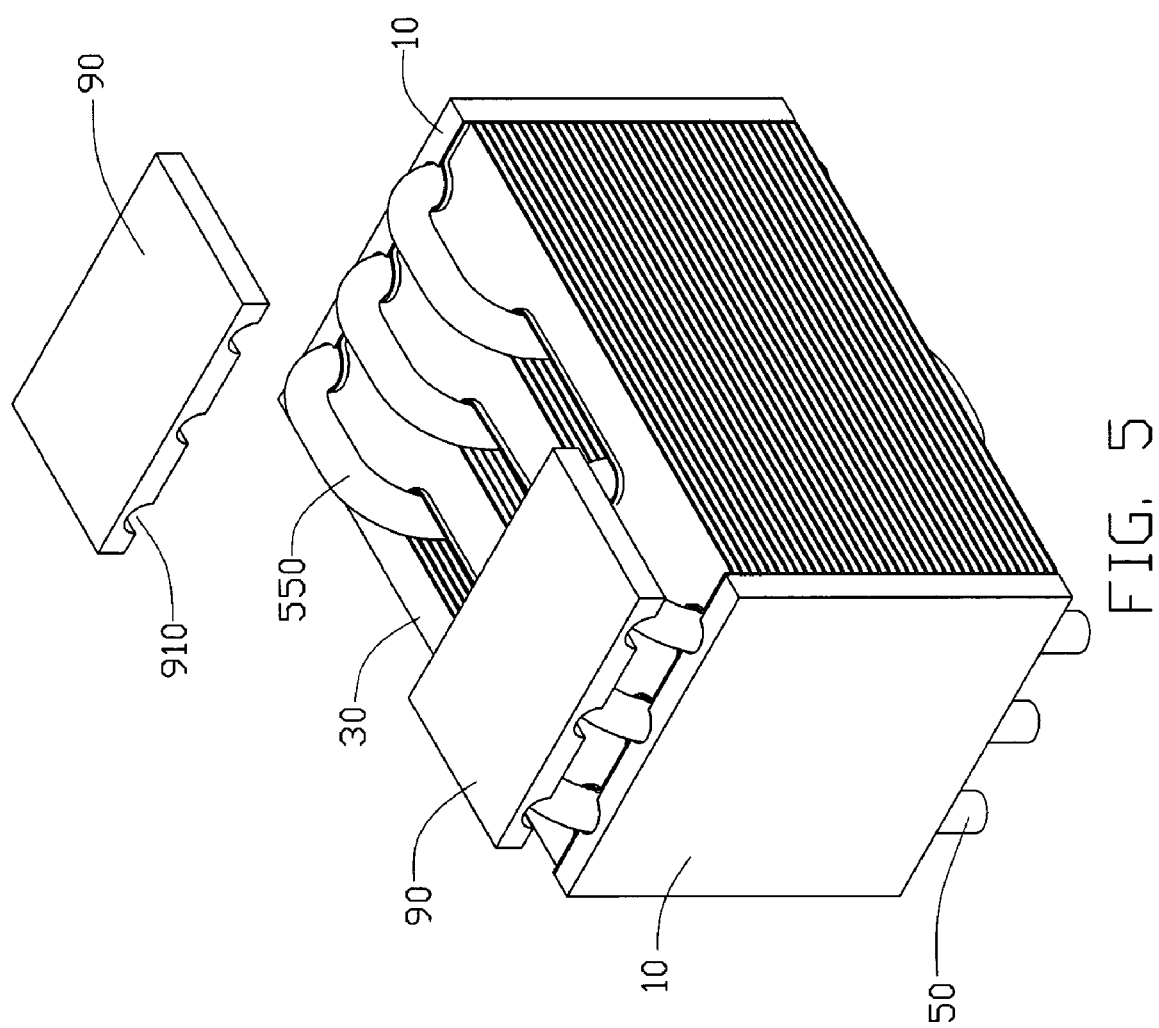
FIG. 5 is an inverted and partially exploded isometric view of a heat dissipation device in accordance with a third embodiment of the present invention.
Figure 6:
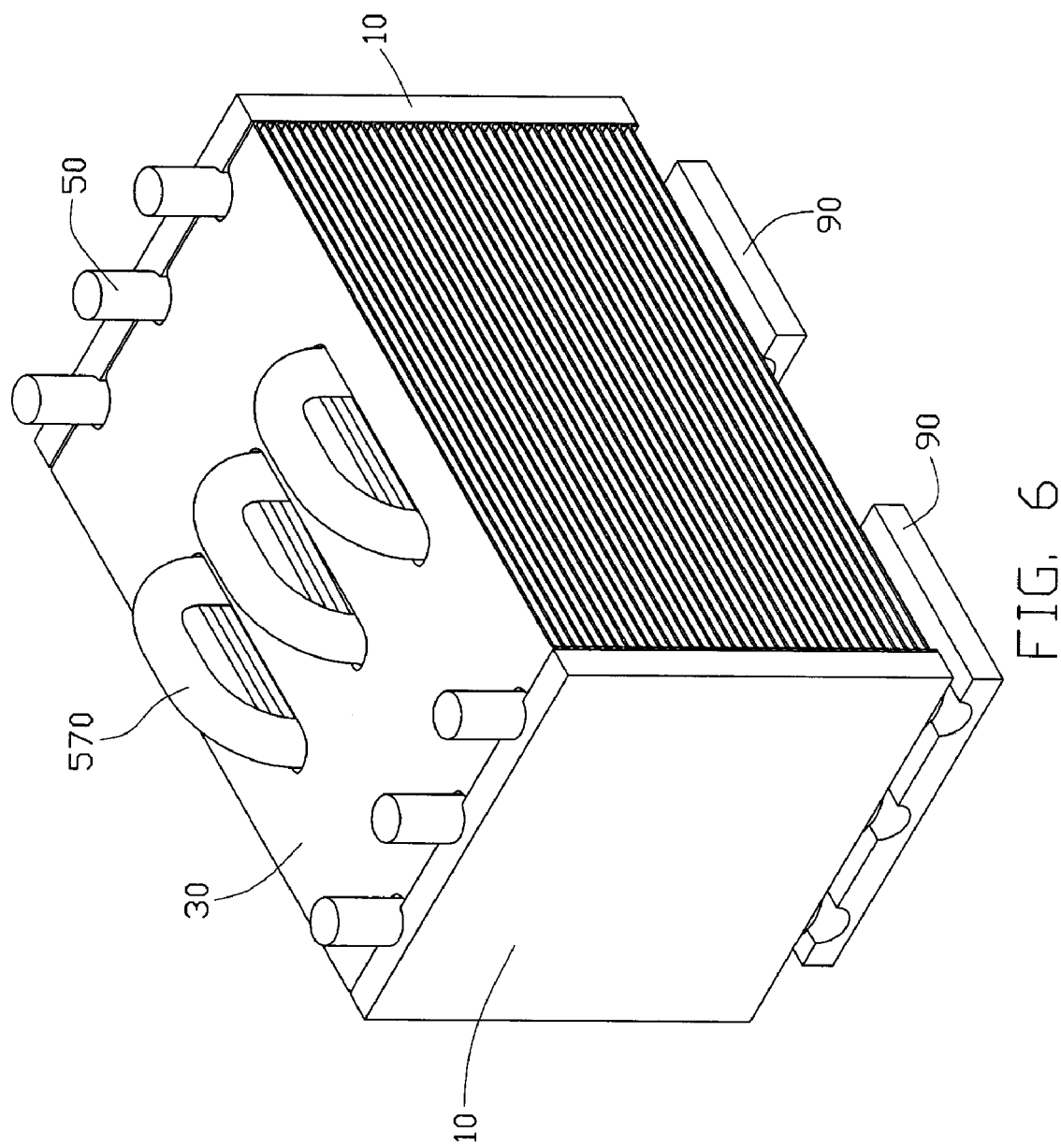
FIG. 6 is an assembled view of FIG. 5 but in a normal state.

Referring to FIGS. 5 and 6, a heat dissipation device of a third embodiment of the invention is shown. The heat dissipation device is similar to the heat dissipation device of the first embodiment of the invention. The difference therebetween is that the heat dissipation device further comprises two plates 90 thermally contacting the heat pipes 50. Each plate 90 defines three parallel grooves 910 therein, and the first connecting sections 550 of the heat pipes 50 are respectively received in the grooves 910 of the corresponding plates 90. In use, the two plates 90 are respectively attached to two electronic devices. The heat generated by the electronic devices is absorbed by the two plates 90 and then transmitted to the first connecting sections 550 of the heat pipes 50. The heat in the first connecting sections 550 is subsequently delivered to different parts of the fins 30 and the bases 10 by the first sections 510 and the second sections 530 of the heat pipes 50. In this case, the heat dissipation device has two plates 90 at a side of the fins; thus the heat dissipation device can be used for two electronic devices simultaneously via the two plates 90 contacting the two electronic devices.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a fin set comprising a plurality of fins, the fin set defining at least a passageway in a middle of thereof;
at least a sinuous heat pipe having two sealed ends and phase-changeable working fluid sealed therein, the at least a heat pipe being vacuum-sealed and transferring heat to different parts of the fin set, the at least a heat pipe comprising a bent portion received in the at least a passageway and thermally engaging with the fin set at two edges of the passageway; and a first base for absorbing heat from an electronic device, the first base thermally contacting the at least a heat pipe for transferring the heat to the at least a heat pipe and the fin set from which the heat is dissipated to ambient air.

2. The heat dissipation device of claim 1, wherein the at least a heat pipe comprises a first section which transfers the heat to a lateral part of the fin set, and a first connecting section connecting the first section and the bent portion.

3. The heat dissipation device of claim 2, wherein the bent portion of the at least a heat pipe comprises two straight second sections each thermally contacting the fin set and a second connecting section connecting the two straight sections.

4. The heat dissipation device of claim 3, wherein the two second sections of the at least a heat pipe are positioned at the two edges of the at least a passageway of the fin set.

5. The heat dissipation device of claim 3, wherein the first connecting section and the second connecting section are respectively positioned two sides of the fin set.

6. The heat dissipation device of claim 5, wherein the at least a heat pipe comprises an additional first section which transfers the heat to another lateral part of the fin set, and an additional first connecting section connecting the additional first section and the bent portion, and wherein the second sections of the at least a heat pipe are between the two first sections.

7. The heat dissipation device of claim 6 further comprising a second base, wherein the fins are sandwiched between the first and second bases.

8. The heat dissipation device of claim 7, wherein the two first sections of the at least a heat pipe thermally contact the first and second bases, respectively.

9. The heat dissipation device of claim 5, wherein the second connecting section of the at least a heat pipe thermally contacts the first base.

10. The heat dissipation device of claim 9 further having two bases sandwiching the fins therebetween, wherein the first section thermally contacts one of the two bases.

11. The heat dissipation device of claim 6 further comprising a second base, wherein the first base and the second base are located at a same side of the fin set, and the two first connecting sections of the at least a heat pipe thermally contact the first base and the second base, respectively.

12. The heat dissipation device of claim 11 further comprising two bases sandwiching the fins therebetween, wherein the first sections thermally contact the two bases, respectively.

13. A heat dissipation device comprising:
a fin set having a plurality of fins, the fin set defining a passageway in a middle of the fin set;
a serpentine heat pipe with phase changeable working fluid sealed therein, the heat pipe being vacuum-sealed and transferring heat to different parts of each of the fins, the heat pipe comprising a U-turn portion received in the passageway and thermally contacting the fin set; and a base for absorbing the heat from an electronic device, thermally contacting the heat pipe and transferring the heat to the heat pipe and the fin set from which the heat is dissipated to ambient air.

14. The heat dissipation device of claim 13, wherein the heat pipe comprises two spaced first sections thermally contacting two sides of the fin set respectively.

15. The heat dissipation device of claim 14 further comprising a base, wherein the fin set is sandwiched between the two bases, and wherein the two first sections thermally contact the two bases.

16. The heat dissipation device of claim 14, wherein the heat pipe comprises two first connecting sections connecting the first sections and the U-turn portion, and wherein the heat dissipation device further has two bases, the two first connecting sections are positioned at a side of the fins and respectively thermally contact the two bases.

17. The heat dissipation device of claim 14, wherein the U-turn portion of the heat pipe comprises two straight sections each thermally contacting each of the fins, and a second connecting section connecting the two straight sections, and wherein the second connecting section is positioned at a side of the fins and thermally contacts the base.

18. A heat dissipation device comprising:
a plurality of fins cooperatively defining a first side, a second side opposite to the first side and a passageway between the first and second sides;
a serpentine heat pipe having phase changeable working fluid sealed therein, the heat pipe being vacuum-sealed and having a middle U-shaped portion and first and second L-shaped portions located at two sides of the U-shaped portion, respectively;
wherein the U-shaped portion is inserted into the passageway and thermally engages with the fins, the first L-shaped portion thermally engages with the first side of the fins and the second L-shaped portion thermally engages with the second side of the fins.

19. The heat dissipation device of claim 18 further comprising a plate for absorbing heat from a heat-generating device, wherein the plate thermally engages with the first L-shaped portion of the heat pipe and the first side of the fins.

20. The heat dissipation device of claim 18 further comprising a plate thermally engaging with the U-shaped portion of the heat pipe for transferring heat from an electronic device to the heat pipe.

21. The heat dissipation device of claim 18 further comprising two plates for transferring heat from two heat-generating devices to the heat pipe, wherein the two plates respectively thermally engage with the first and second L-shaped portions of the heat pipe, and the two plates are located at a same side of the fins.

* * * * *